(12) United States Patent
Suess et al.

(10) Patent No.: US 10,571,527 B2
(45) Date of Patent: Feb. 25, 2020

(54) MAGNETIC SENSOR DEVICE AND MAGNETIC SENSING METHOD

(71) Applicant: Infineon Technologies AG, Neubiberg (DE)

(72) Inventors: Dieter Suess, Vienna (AT); Hubert Brueckl, Wiener Neudorf (AT); Klemens Pruegl, Regensburg (DE); Wolfgang Raberg, Sauerlach (DE); Armin Satz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 153 days.

(21) Appl. No.: 15/602,923

(22) Filed: May 23, 2017

(65) Prior Publication Data

US 2018/0003776 A1 Jan. 4, 2018

(30) Foreign Application Priority Data

Jun. 30, 2016 (DE) .................. 10 2016 112 008

(51) Int. Cl.
*G01R 33/00* (2006.01)
*G01R 33/09* (2006.01)

(52) U.S. Cl.
CPC ........ *G01R 33/0011* (2013.01); *G01R 33/093* (2013.01); *G01R 33/098* (2013.01)

(58) Field of Classification Search
CPC . G01R 33/0011; G01R 33/098; G01R 33/093
See application file for complete search history.

(56) References Cited

U.S. PATENT DOCUMENTS

| 3,553,660 | A | * | 1/1971 | Wolf | G11C 11/14 365/133 |
| 6,735,062 | B1 | * | 5/2004 | Pokhil | B82Y 10/00 360/324.12 |
| 7,356,909 | B1 | | 4/2008 | Min et al. | |
| 7,697,243 | B1 | * | 4/2010 | Novosad | B82Y 10/00 324/207.21 |
| 2005/0174701 | A1 | * | 8/2005 | Kasiraj | G11B 5/1278 360/324.2 |

(Continued)

FOREIGN PATENT DOCUMENTS

| CN | 1898574 A | 1/2007 |
| CN | 100440564 C | 12/2008 |

(Continued)

OTHER PUBLICATIONS

German Patent Office, Office Action dated for DE 102016112008.1, 6 pgs., dated Mar. 14, 2017.

(Continued)

*Primary Examiner* — Lee E Rodak
(74) *Attorney, Agent, or Firm* — Schiff Hardin LLP

(57) ABSTRACT

The present disclosure relates to a magnetic sensor device having at least one magneto-resistive structure. The magneto-resistive structure comprises a magnetic free layer configured to generate a closed flux magnetization pattern in the free layer, and a magnetic reference layer having non-closed flux reference magnetization pattern; and a magnetic flux concentrator configured to increase a flux density of an external magnetic field in the magnetic free layer.

20 Claims, 13 Drawing Sheets

(56) References Cited

U.S. PATENT DOCUMENTS

| | | | |
|---|---|---|---|
| 2007/0063690 A1 | 3/2007 | De Wilde et al. | |
| 2008/0180865 A1* | 7/2008 | Min | B82Y 10/00 360/324.11 |
| 2009/0195941 A1* | 8/2009 | Zhou | B82Y 25/00 360/324.12 |
| 2009/0309581 A1 | 12/2009 | Fermon et al. | |
| 2013/0265039 A1 | 10/2013 | Cai et al. | |
| 2015/0177285 A1* | 6/2015 | Higashi | G01R 19/0092 324/144 |

FOREIGN PATENT DOCUMENTS

| | | |
|---|---|---|
| CN | 103412269 A | 11/2013 |
| CN | 104749536 A | 7/2015 |
| EP | 2712078 B1 | 6/2015 |
| TW | 201337303 A | 9/2013 |

OTHER PUBLICATIONS

Office Action dated Jun. 3, 2019 for Chinese Application No. 201710523414.6.

* cited by examiner

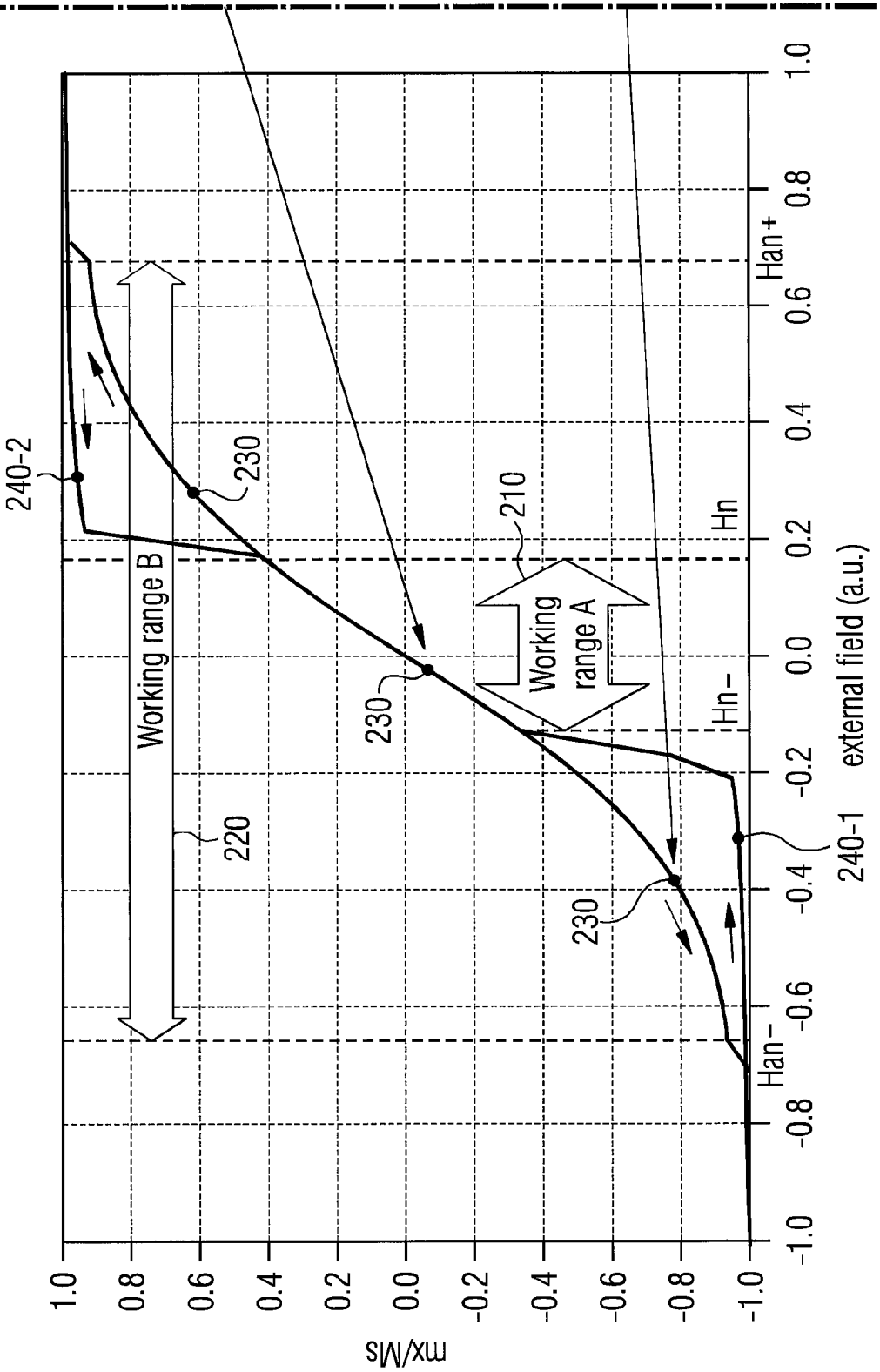
FIG. 2 Part 1

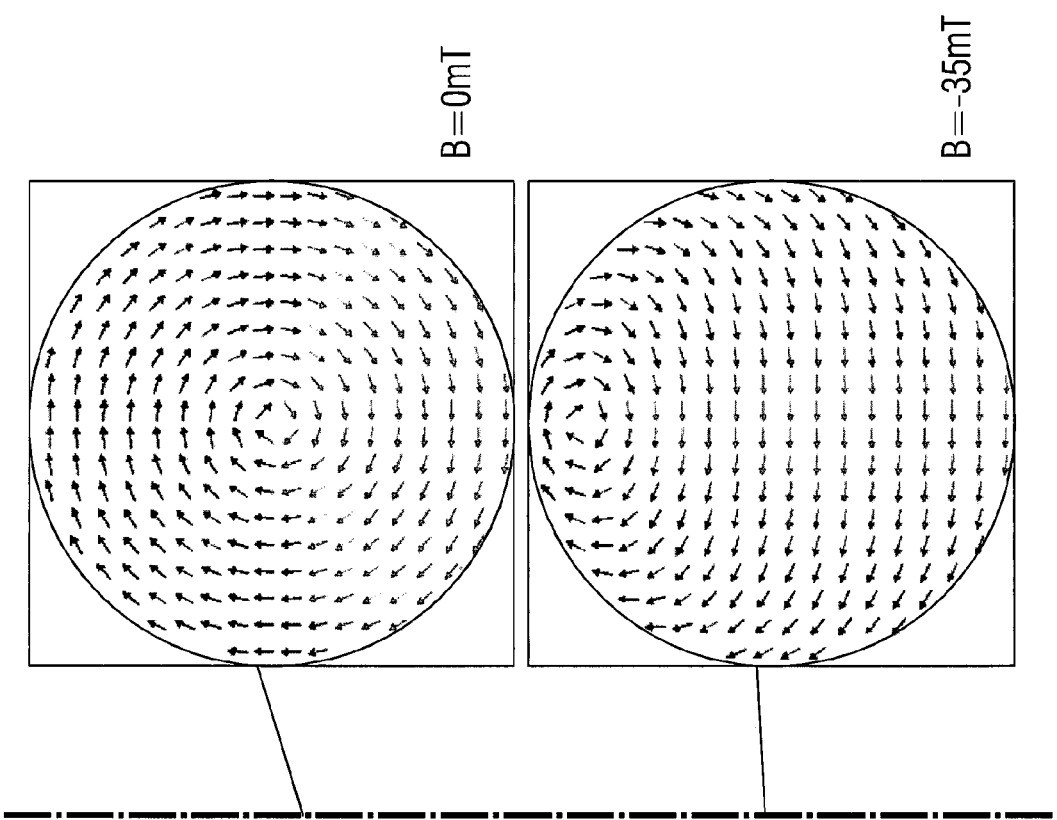
FIG. 2 Part 2

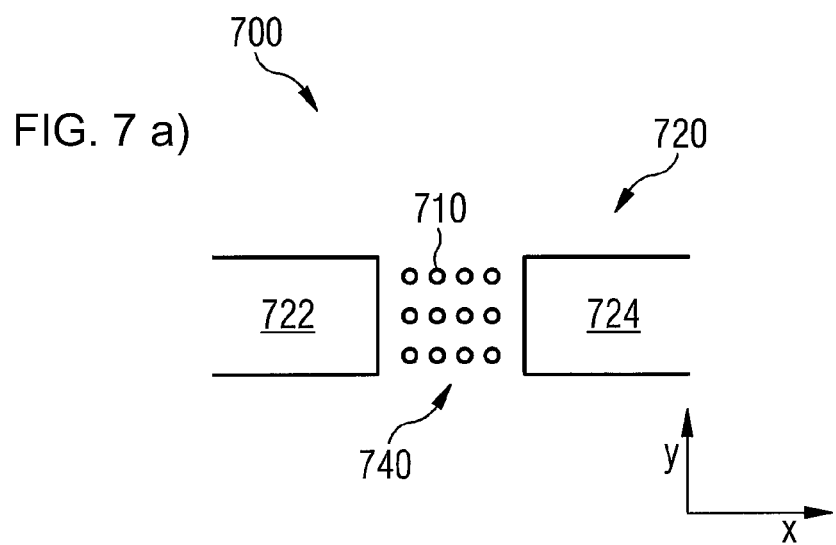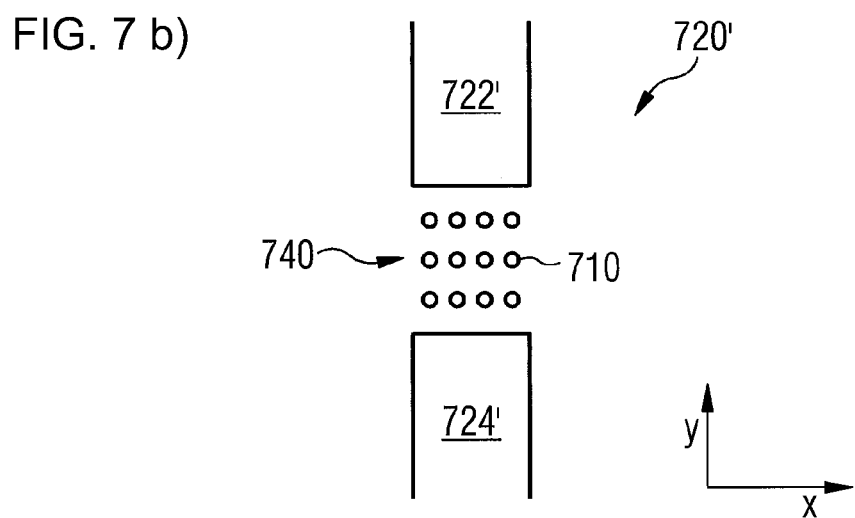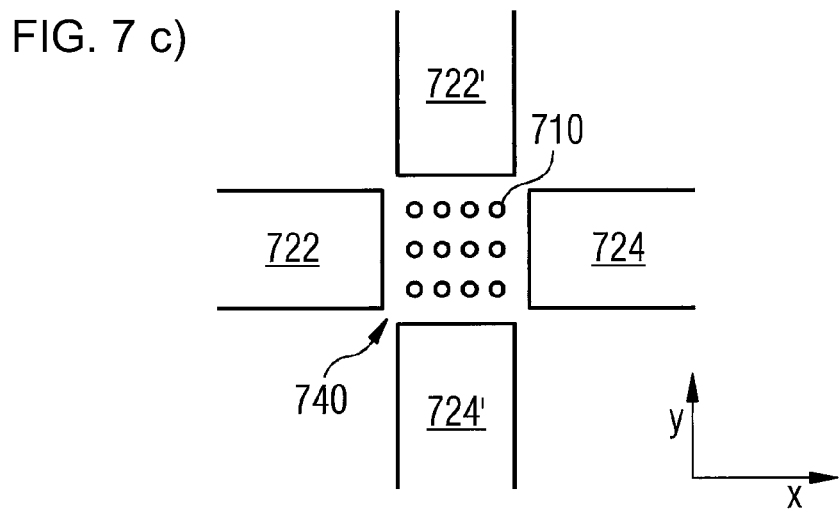

FIG. 8
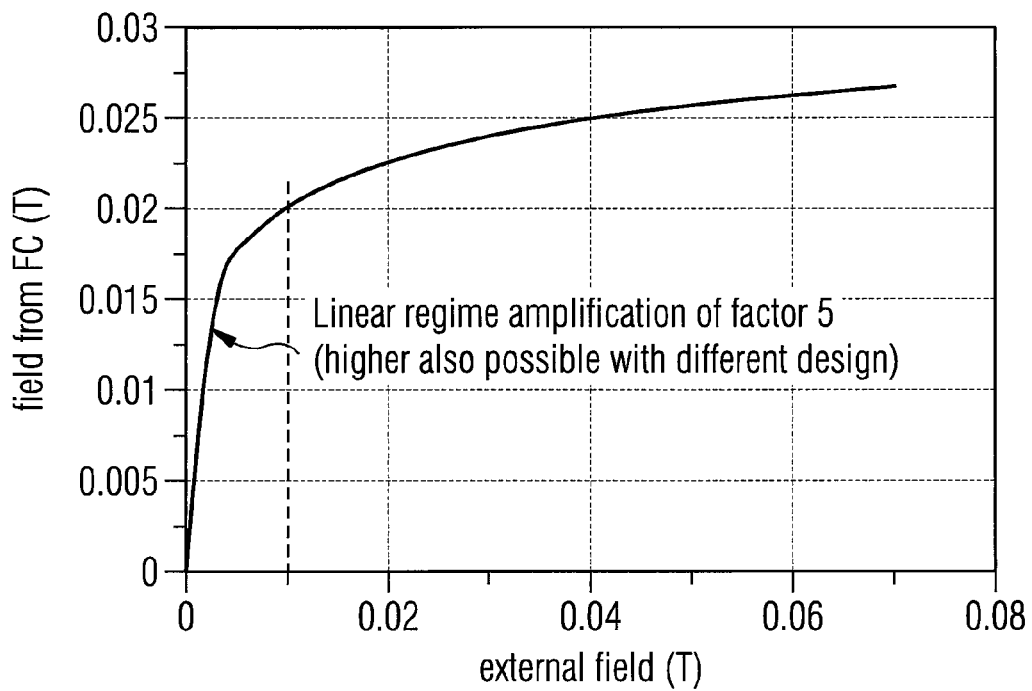
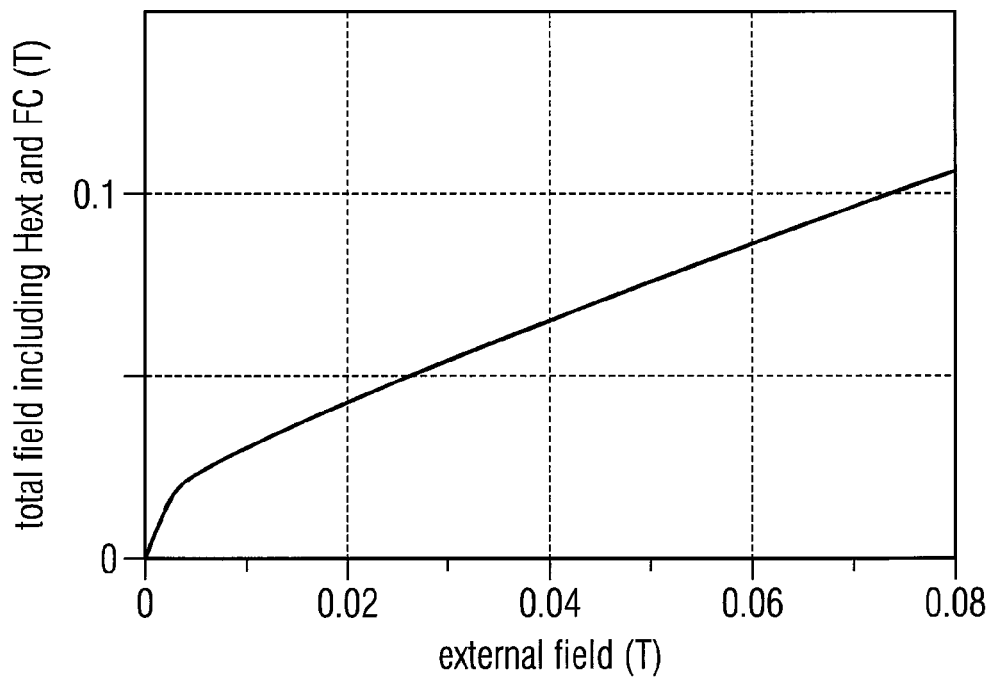

FIG. 9
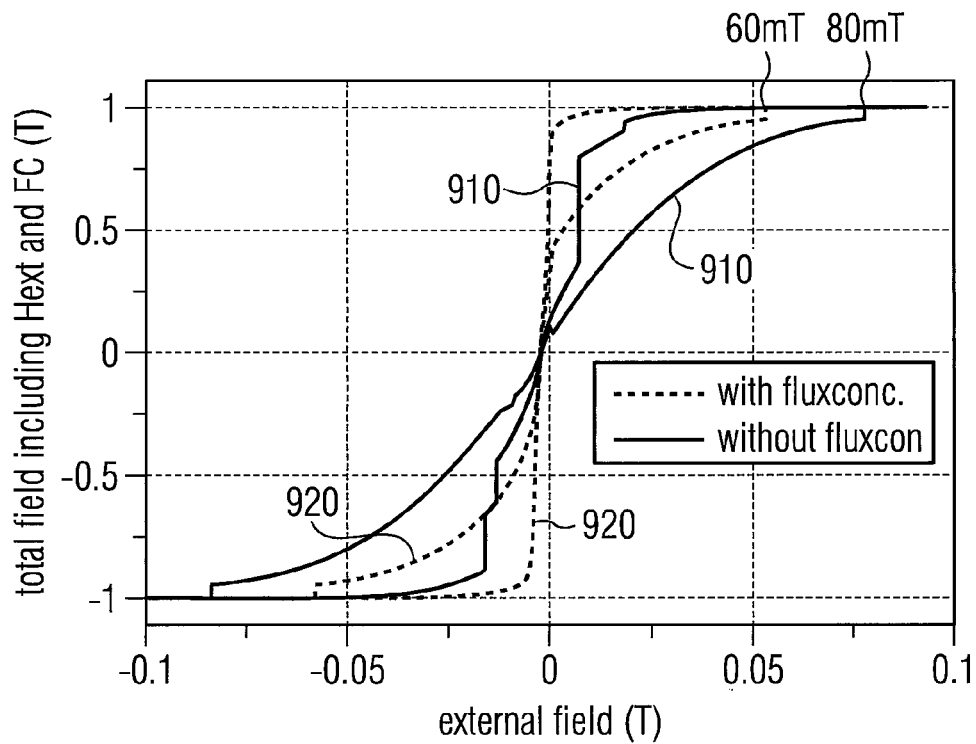
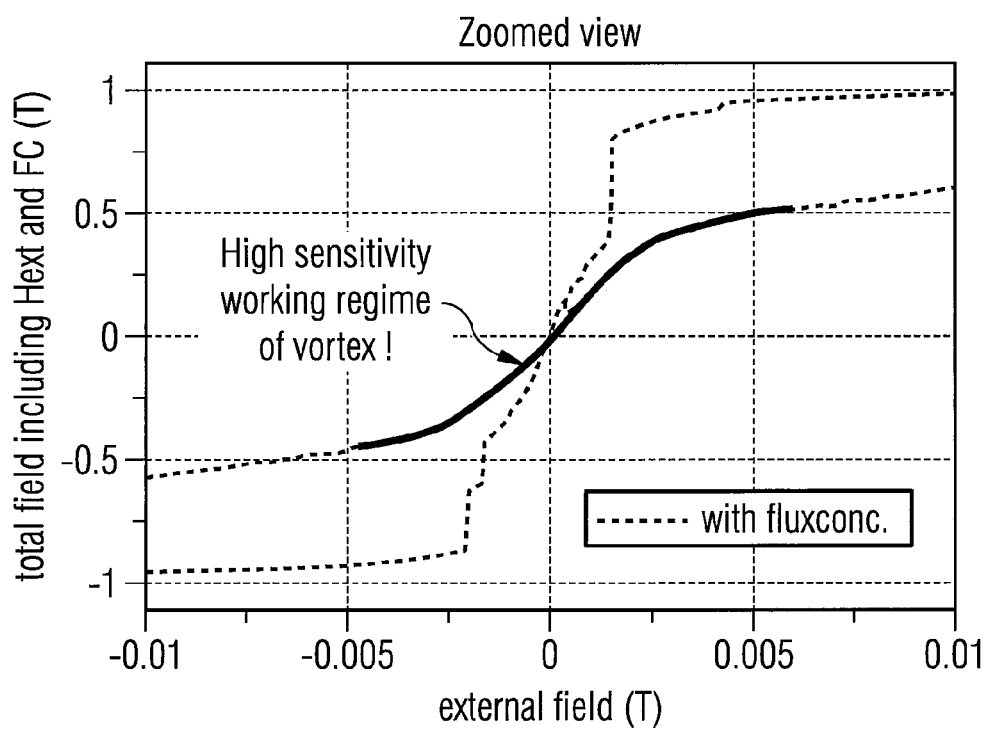

MAGNETIC SENSOR DEVICE AND MAGNETIC SENSING METHOD

FIELD

The present disclosure generally relates to magnetic sensor devices and methods and, more particularly, to magnetic sensor devices and methods using magneto-resistive structures.

BACKGROUND

Magneto-resistive effects include a number of different physical phenomena, all of which having in common that an electrical resistance of a resistive element is alterable by the behavior of a magnetic field penetrating the resistive element. Technologies utilizing magneto-resistive effects are sometimes referred to as "xMR technologies", whereby the "x" indicates that a multitude of effects may be addressed here, like the Giant Magneto-Resistive (GMR) effect, the Tunnel Magneto-Resistive (TMR) effect, or the Anisotropic Magneto-Resistive (AMR) effect, to mention just a few examples. xMR effects may be applied in a variety of field-based sensors, for example for measuring revolution, angles, etc. In some applications, especially in applications relevant to safety, it is required that these sensors operate reliably and at a high level of accuracy.

A sensor may, in some applications, be subject to perturbations in the form of unknown or incalculable magnetic fields. These perturbations may randomly change a state or an initial value of the sensor. Since hysteresis behavior of the sensor may result in a substantial difference whether a measured value is approached from an initial value above or below the measured value, hysteresis may lead to an error in measurement results. A magnetic xMR sensor concept with a free layer in a vortex configuration (closed flux magnetization pattern) may have nearly zero hysteresis. Low hysteresis may in other words be achieved in the presence of a vortex shaped magnetization state (magnetic field) in the free layer, and may especially be interesting in applications such as wheel speed sensing, current sensing, or linear field sensing. The vortex shaped magnetization state, however, may only be stable in a certain range regarding field strength of the applied field to be measured.

It is hence desirable to provide a sensor element enabling improved accuracy and reliability of measurement results.

SUMMARY

According to a first aspect of the present disclosure, it is provided a magnetic sensor device with at least one magneto-resistive (xMR) structure. The at least one magneto-resistive structure includes a magnetic free layer which is configured to generate a closed flux magnetization pattern (e.g., vortex shaped magnetization state) in the free layer. Further, the magneto-resistive structure includes a magnetic reference layer having a non-closed flux reference magnetization pattern. The magnetic sensor device also comprises a magnetic flux concentrator configured to increase a flux density of an external magnetic field in the magnetic free layer.

The xMR structure may for example be formed by alternating magnetic and non-magnetic layers. The terms "magnetic" and "non-magnetic" may in this context be understood as "ferromagnetic" and "non-ferromagnetic". A "non-magnetic" layer may thus have paramagnetic, diamagnetic or antiferromagnetic properties. A layer may extend essentially into two directions x and y of a Cartesian coordinate system with three pair-wise perpendicular directions x, y, and z. In other words, an extension of the layer into a third direction z may be comparably small compared to its extension into the first and second directions x and y.

The closed flux magnetization pattern may also be referred to as a vortex state in the sequel. A spontaneously generated vortex state may for instance form in the free layer directly after its production, or if no external field is applied. The non-closed flux reference magnetization pattern may on the other hand correspond to a homogeneous, straight, or linear magnetization field having zero curl and zero divergence.

In some examples, the magnetic free layer of the xMR structure is of centrally symmetric shape. This shape may in other words result from rotation by a predetermined angle around a central axis parallel to the z-direction, and for example comprise equiangular, equilateral, or regular polygons (triangle, square, hexagon, etc.), or ellipses. Spontaneous vortex formation may thus be facilitated. The shape of the free layer may, among other factors, determine an original width of the vortex formation range for the external field if no biasing field is applied.

In some examples, the magnetic free layer xMR structure is of rotationally symmetric shape. In other words, the free layer may exhibit a disk shape. Spontaneous vortex formation may be facilitated even further if a disk shape is used.

In some examples, a ratio between a thickness and a diameter of the magnetic free layer is in a range from 1/500 to 1/5. Thickness may be measured along z-direction, and diameter in x-y plane. If the free layer has a non-circular shape, diameter may correspond to e.g. a major or a minor axis of an ellipse, or to a diameter of an inscribed or a circumscribed circle of a polygon. The ratio between thickness and diameter of the free layer may provide another factor that may determine an original width of the vortex formation range for the external field. By choosing a value within the abovementioned range vortex formation may be significantly alleviated.

In some examples, the free layer has a thickness exceeding a thickness of the reference layer by at least a factor of three. This may help to keep the exchange bias effect in the free layer low compared to the reference layer and a sensitivity of the sensor may be increased.

In some examples, the magnetic flux concentrator is implemented in the same layer as or in a layer different from (above or below) the magnetic free layer. Proximity between the magnetic flux concentrator and the magnetic free layer allows for an efficient increase of the flux density of the external magnetic field in the magnetic free layer.

In some examples, the magnetic flux concentrator is configured to increase the magnetic flux density of the external magnetic field parallel to a straight line. In other words, at least portions of the magnetic flux concentrator extend linearly.

In some examples, the magnetic flux concentrator is configured to increase the magnetic flux density parallel to the reference magnetization pattern of the magnetic reference layer. In other words, at least portions of the magnetic flux concentrator extend linearly and in parallel to the reference magnetization pattern of the magnetic reference layer.

In some examples, the magnetic flux concentrator is configured to transform an external magnetic field perpendicular to the reference magnetization pattern into a magnetic field parallel to the reference magnetization pattern of the magnetic reference layer.

In some examples, the magnetic flux concentrator is configured to cause a magnetic stray field in the magnetic free layer. This can be done by adequate geometry or shape of the magnetic flux concentrator.

In some examples, the magnetic flux concentrator comprises at least two portions separated by a gap. The magnetic free layer can be positioned proximate to said gap, for example in, above or below the gap of the magnetic flux concentrator.

In some examples, the magnetic flux concentrator comprises a pair of opposing protrusions separated by the gap. The protrusions may extend linearly along a straight line, respectively.

In some examples, the protrusions extend parallel to the (linear) reference magnetization pattern of the magnetic reference layer.

In some examples, the magnetic flux concentrator is configured to magnetically saturate if a strength of the external magnetic field exceeds a threshold value smaller than an annihilation field strength of the closed flux magnetization pattern. In other words, the magnetic flux concentrator is configured to magnetically saturate before the vortex is destroyed.

In some examples, the magnetic flux concentrator comprises soft-magnetic material.

In some examples, one or more soft-magnetic via-structures, for example dedicated Through-Silicon Via(s) (TSV), could be used as magnetic flux concentrator.

In some examples, the xMR structure is a GMR or TMR structure, each of which can be operated in Current-In-Plane (CIP) or Current-Perpendicular-to-Plane (CPP) configuration, respectively.

According to a further aspect of the present disclosure, it is provided a magnetic sensor device comprising a magnetic flux concentrator and a plurality of xMR sensor elements arranged proximate the magnetic flux concentrator for magnetic interaction. Each xMR sensor element comprises a respective magnetic free layer configured to generate a vortex magnetization pattern in the respective magnetic free layer.

In some examples, the plurality of xMR sensor elements are arranged proximate a material gap of the magnetic flux concentrator.

In some examples, the respective magnetic free layers of the plurality of magneto-resistive sensor elements are positioned in, below or above the material gap of the magnetic flux concentrator.

According to yet a further aspect of the present disclosure, it is provided a magnetic sensing method. The method includes increasing a magnetic flux density of an external magnetic field in a magnetic free layer of at least one magneto-resistive structure, the magnetic free layer comprising a vortex magnetization pattern, by arranging the magnetic free layer proximate a magnetic flux concentrator.

BRIEF DESCRIPTION OF THE FIGURES

Some embodiments of apparatuses and/or methods will be described in the following by way of example only, and with reference to the accompanying figures, in which

FIG. 2 shows a schematic hysteresis loop of a single, disk-shaped free layer element showing vortex-characterizing nucleation field and annihilation field;

FIG. 7a-c illustrate a plurality of xMR vortex sensor elements arranged in a gap of a magnetic flux concentrator, respectively, FIG. 8 shows a generated field from the flux concentrator (left) and a total field (right) which is the sum of the generated field from the flux concentrator and the external field;

FIG. 9 shows a comparison of vortex transfer curve with and without flux-concentrator (left) and a detailed view of the amplified region (right);

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Figure 1:
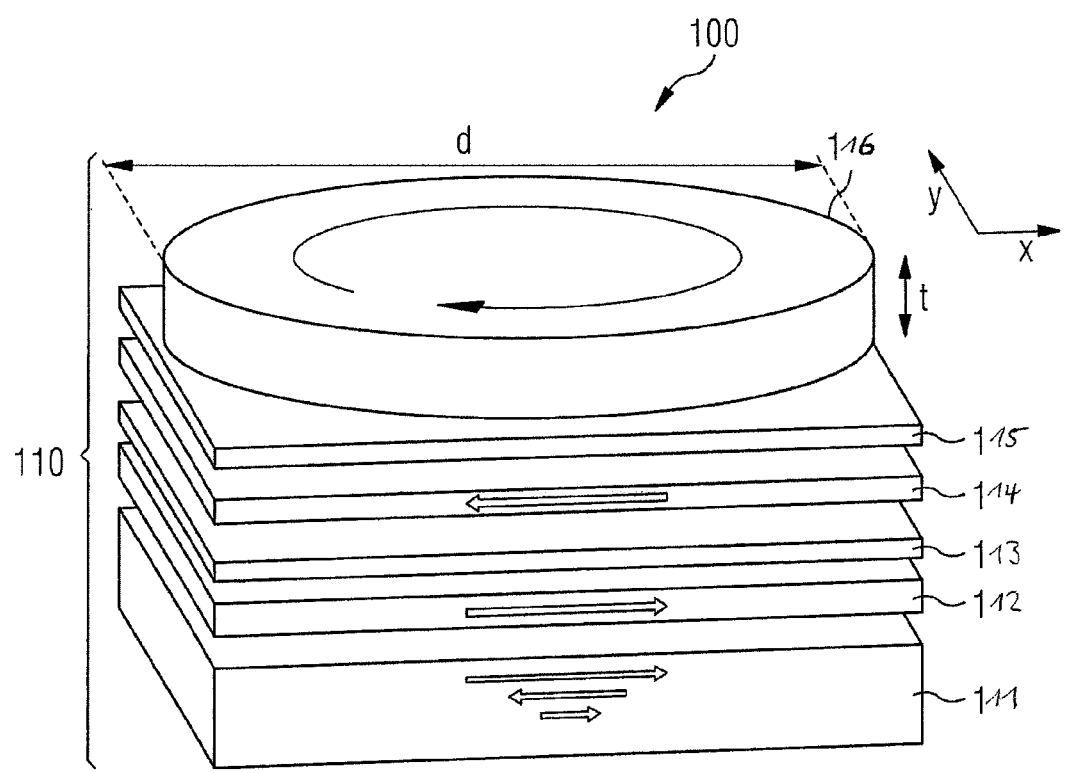
FIG. 1 shows an exploded view example of a TMR Bottom Spin Valve, BSV, structure with a free layer in magnetic vortex state.

FIG. 1 shows an example of a tunnel-magneto-resistive, TMR, sensor element 100, which is also known as a spin valve or Bottom Spin Valve (BSV). TMR sensor element 100 has a layer stack 110 of alternating ferromagnetic and non-ferromagnetic layers arranged on a common substrate (not shown). If described in a Cartesian coordinate system with pair-wise perpendicular coordinate axes x, y, and z, the layers each extend in a plane spanned by the x and y axes. The extent of a layer in z-direction may be described as the layer thickness t.

From the bottom up, TMR sensor element 100 comprises an antiferromagnetic pinning layer 111 and a ferromagnetic pinned layer 112. Contact between pinning layer 111 and pinned layer 112 provokes an effect known as exchange bias effect, causing the magnetization of pinned layer 112 to align in a preferred direction. In other words, pinned layer 112 exhibits a linear magnetic flux pattern which, in the example of FIG. 1, is parallel to the x-direction. TMR sensor element 100 further comprises a coupling layer 113. Coupling layer 113 may be diamagnetic and for example comprise ruthenium, iridium, copper or copper alloys and similar materials. Coupling layer 113 spatially separates pinned layer 112 from a ferromagnetic reference layer 114. Using this setup, magnetization of reference layer 114 may align and be held in a direction anti-parallel to the magnetization of pinned layer 112. TMR sensor element 100 also comprises a tunnel barrier 115 which is electrically insulating and separates reference layer 114 from a ferromagnetic free layer 116. Free layer 116, reference layer 114 and pinned layer 112 may in some embodiments comprise iron, cobalt or nickel, and in some further embodiments alloys of these. Alloys may also comprise non-ferromagnetic materials, e.g. carbon, boron, nitrogen and oxygen, with ferromagnetic materials constituting at least 50% of a material composition of the respective layer. For example, layers may comprise cobalt-iron, CoFe, CoFeB, or nickel-iron, NiFe, alloys. In contrast, pinning layer 111 may comprise for example iridium, manganese, platinum, or alloys comprising these.

While in operation, or when coupled to an electric circuit, electrical charges may pass from one side of tunnel barrier 115 to the other in a predetermined amount if a constant external magnetic field is applied. The TMR effect is a quantum physical phenomenon expressing itself in a change of the amount of charges passing the tunnel barrier when the direction of the external magnetic field is changed. This effect may arise due to directional changes of the magnetization of free layer 170 caused by the changing external magnetic field.

Free layer 116 in FIG. 1 is of circular shape, or, in other words, has a disk-like structure. The disk has a diameter d which may, for example be in a range of several hundred nm to 10 μm. The disk further has a thickness t in the range of e.g. 10 nm to 300 nm. The thickness may exceed a thickness of the reference layer 114 by at least a factor of 3. Providing a layer having a rotationally symmetric structure may lead to spontaneous formation of a closed flux magnetization pattern in free layer 116. Depending on the exact shape of free layer 116, the closed flux magnetization pattern may, for instance, comprise at least partially a Landau pattern, a circumferential pattern, a vortex pattern or a combination of any of the previously-mentioned patterns. A Landau pattern comprises at least partially a polygon-like closed shape, while a circumferential pattern may comprise a smoother, rounder closed shape. A pure vortex pattern may be essentially circular. However, an in-plane closed flux magnetization pattern may comprise any combination of the previously-mentioned patterns. Moreover, a closed magnetization line of a magnetization pattern may be fully shaped according to any of the previously-mentioned patterns, but may also comprise sections following a different closed flux magnetization pattern. The different types of closed flux magnetization pattern may also be commonly referred to as vortex. The vortex state may in other words be obtained by choosing the disk thickness t in the range of e.g. 30 nm to 300 nm and the disk diameter d between 500 nm and 5 μm. In a vanishing external magnetic field, a center of the vortex may be essentially located at a center of the magnetic free layer 116 such that a net magnetization of the respective magnetic free layer essentially vanishes.

The skilled person having benefit from the present disclosure will appreciate that vortex spin valve structures are not limited to the TMR effect. Other examples of the present disclosure can be implemented using Giant Magneto-Resistive (GMR) structures or based on other xMR effects.

A magnetic xMR sensor concept with a free layer in vortex configuration may have nearly zero hysteresis which may be especially interesting in applications such as wheel speed sensing or current sensing. Prerequisite for low hysteresis may be the presence of the vortex state. Critical parameters which may describe the regime in which the vortex state exists are nucleation field $H_n$, where the vortex nucleates, and annihilation field $H_{an}$, where it gets destroyed again.

FIG. 2 depicts a schematic hysteresis loop of a single, disk-shaped free layer element showing the vortex characteristics nucleation field $H_n$ and annihilation field $H_{an}$. Plotted is a normalized in-plane component (or the x-component) of the magnetization $M_x/M_s$ against the external field, which is equivalent to the sensor signal of an according spin valve structure. Therein, two different working ranges may be distinguished. Working range A, or vortex formation range 210, is defined by the nucleation fields $H_{n+}$ and $H_{n-}$, and may be unaffected by the magnetic history since vortex nucleation may always be ensured. Working range B, or vortex annihilation range 220, is defined by the annihilation fields $H_{an+}$ and $H_{an-}$, and as long as it is not exceeded (for example by a disturbance in form of a magnetic field pulse) the vortex state may be preserved. In other words, the in-plane component of the magnetization $m_x/M_s$ may be shifted along curve 230 by altering the external magnetic field. However, after an event out of vortex annihilation range 220 a "reset" may be needed in order to re-form the vortex structure by reducing the external field strength to a value within vortex formation range 210. In between said event and vortex re-formation, the in-plane component of the magnetization $m_x/M_s$ may follow a hysteresis curve 240-1, 240-2.

If the external field exceeds the annihilation field the vortex is destroyed. Reducing the field below the nucleation field is required to reform the vortex. As can be concluded from FIG. 2, the nucleation field can be close to zero. Hence, if in an application due to various reasons the applied field never approaches zero (e.g. a rotating field is applied with a magnitude always larger then ($H_n$)) the vortex does not form again.

xMR vortex sensors can have multiple advantages over elliptical/rectangular elements such as small hysteresis, they can be essentially jitter free and insensitive to transversal bias fields ($B_y$). On the other hand, xMR vortex sensors may have rather moderate sensitivity. Whereas the small sensitivity of vortex sensors can be regarded as an advantage since this may inherently lead to a large linear regime, various applications require a sensitivity as high as possible. Generally, the sensitivity of vortex sensors can be increased by decreasing the layer thickness t or increasing the diameter d of the disc 116. The ratio between the thickness and the diameter of the magnetic free layer 116 may for example be in a range from 1/500 to 1/5. Alternatively a magnetic material with a lower saturation magnetization can be used for the disc 116. However, these approaches can lead to a decreased nucleation field $H_n$, which may lead to the vortex being no longer formed reliably. Also, the annihilation field $H_{an}$ may be decreased which may lead to the vortex being destroyed and not nucleated again.

The sensitivity of conventional elliptical or rectangular xMR elements can be increased by increasing the size of the element, for example. However, this may lead to an increased domain jitter due to chaotic formation of magnetic domain patterns. Alternatively the shape anisotropy of elliptical elements can be reduced by an aspect ratio closer to one. However, this approach may lead to a strong dependence of the transfer curve as function of bias fields $B_y$.

The present disclosure addresses the aforementioned issues by the use of magnetic Flux-Concentrators (FC). This may allow to increase the sensitivity of xMR vortex sensors without significantly reducing the nucleation and annihilation field. Magnetic flux concentrators can comprise magnetically soft (high permeability) materials to improve the sensitivity of the associated xMR vortex sensors by increasing the magnetic flux at the position of the xMR vortex sensors.

Figure 3:
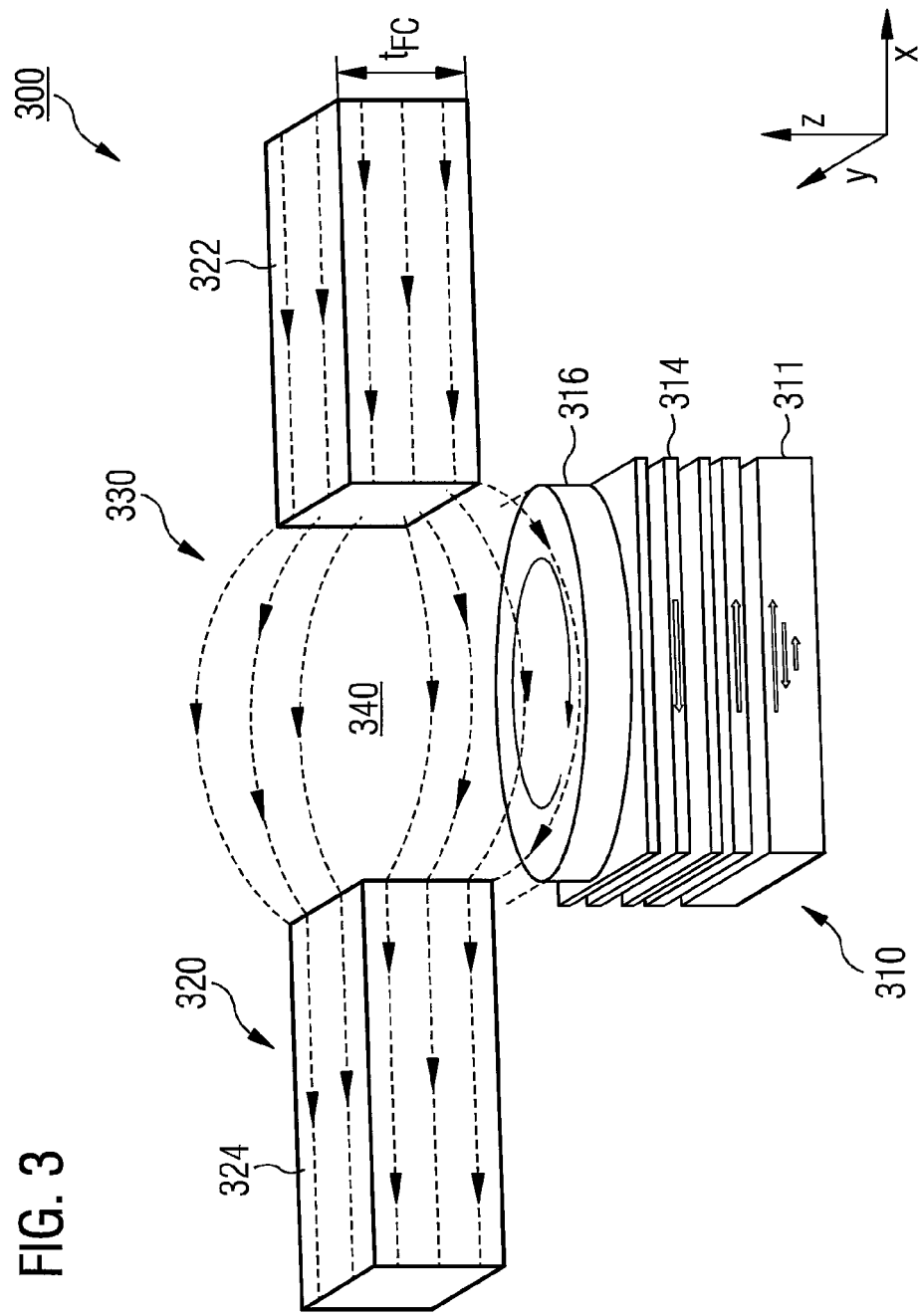
FIG. 3 shows a magnetic sensor device according to an example.

FIG. 3 schematically illustrates a magnetic sensor device 300 according to an example.

The magnetic sensor device 300 comprises at least one xMR vortex sensor element 310 comprising a magnetic free layer 316 configured or formed to generate a closed flux (vortex) magnetization pattern in the free layer 316 and a magnetic reference layer 314 having a non-closed flux reference magnetization pattern, e.g. a linear reference magnetization pattern parallel to the x-axis. Magnetic sensor device 300 further comprises a magnetic flux concentrator 320 which is configured to increase or amplify a flux density of an external magnetic field 330 in the magnetic free layer 316. The magnetic flux concentrator 320 has a thickness (in z-direction) of $t_{FC}$.

The skilled person having benefit from the present disclosure will appreciate that magnetic sensor device 300 can be used to carry out a magnetic sensing method including increasing a magnetic flux density of an external magnetic field in a magnetic free layer of at least one magnetoresistive vortex sensor by arranging the magnetic free layer proximate a magnetic flux concentrator.

Flux concentrator 320 can comprise a soft-magnetic (e.g. ferrous) material used to guide external magnetic field 330 close by or through magnetic free layer 316 and thus to increase the sensitivity of xMR vortex sensor element 310 arranged proximate the flux concentrator 320. When flux concentrator 320 is placed proximate xMR vortex sensor element 310, external magnetic field can channel 330 through flux concentrator 320, thereby increasing the flux density between the concentrator 320 and xMR vortex sensor element 310 or its magnetic free layer 316. Thus, the present disclosure proposes to use a flux-concentrator to amplify the external magnetic field 330, which may be generated by a bias magnet or a magnetic measurement object (e.g. tooth-wheel, camshaft, crankshaft, etc.) itself, for example.

The beauty of a flux concentrator 320 in connection with a vortex sensor 310 is that the flux concentrator (e.g. its material and/or shape) can be designed in a way that only fields 330 smaller than the annihilation field $H_{an}$ are significantly amplified and fields close to the annihilation field $H_{an}$ of the vortex sensor 310 saturate the flux concentrator 320, thus leading to no further amplification of the external field 330. In other words, the magnetic flux concentrator 320 can be configured to magnetically saturate if a strength of the external magnetic field 330 exceeds a predefined threshold value smaller than the annihilation field $H_{an}$ of the vortex magnetization pattern. Said differently, the magnetic flux concentrator 320 can be configured such that the (amplified) flux density of the external magnetic field in the magnetic free layer 316 never exceeds the annihilation field. In some examples, the magnetic flux concentrator 320 could go into magnetic saturation if the external magnetic field 330 gets larger than 60% or 80% of the annihilation field $H_{an}$. This can be done by employing adequate materials and/or geometry for the flux concentrator 320. The skilled person having benefit from the present disclosure will appreciate that the material and/or geometry of flux concentrator 320 will depend on the application of magnetic sensor device 300. As a consequence, external fields 330 are amplified in a regime only where amplification is beneficial. Larger fields, which would destroy the vortex sensor, are not or only little amplified. Hence, a reliable high sensitive vortex sensor setup can be designed.

Various options for the implementation of magnetic flux concentrator 320 are conceivable. For example, magnetic flux concentrator 320 can be implemented as a module separate from xMR vortex sensor element 310 or it 320 can be implemented in the same module and/or on the same substrate (e.g. a semiconductor substrate) as xMR vortex sensor element 310. In the example illustrated in FIG. 3, magnetic flux concentrator 320 is implemented above magnetic free layer 316 of xMR vortex sensor element 310. In some examples, one or more material layers (of a layer stack) above magnetic free layer 316 can be used to implement magnetic flux concentrator 320. The skilled person having benefit from the present disclosure will appreciate that other geometrical relationships between magnetic flux concentrator 320 and xMR vortex sensor element 310 are possible as well. For example, magnetic flux concentrator 320 could also be implemented below or aside of xMR vortex sensor element 310, depending on the envisaged application. In the example illustrated in FIG. 4, magnetic free layer 316 and magnetic flux concentrator 320 are implemented using the same material layer of the layer stack on a common substrate. That is to say, magnetic free layer 316 and magnetic flux concentrator 320 may even be implemented in the same layer of a layer stack comprising ferromagnetic and non-ferromagnetic layers.

Figure 4:
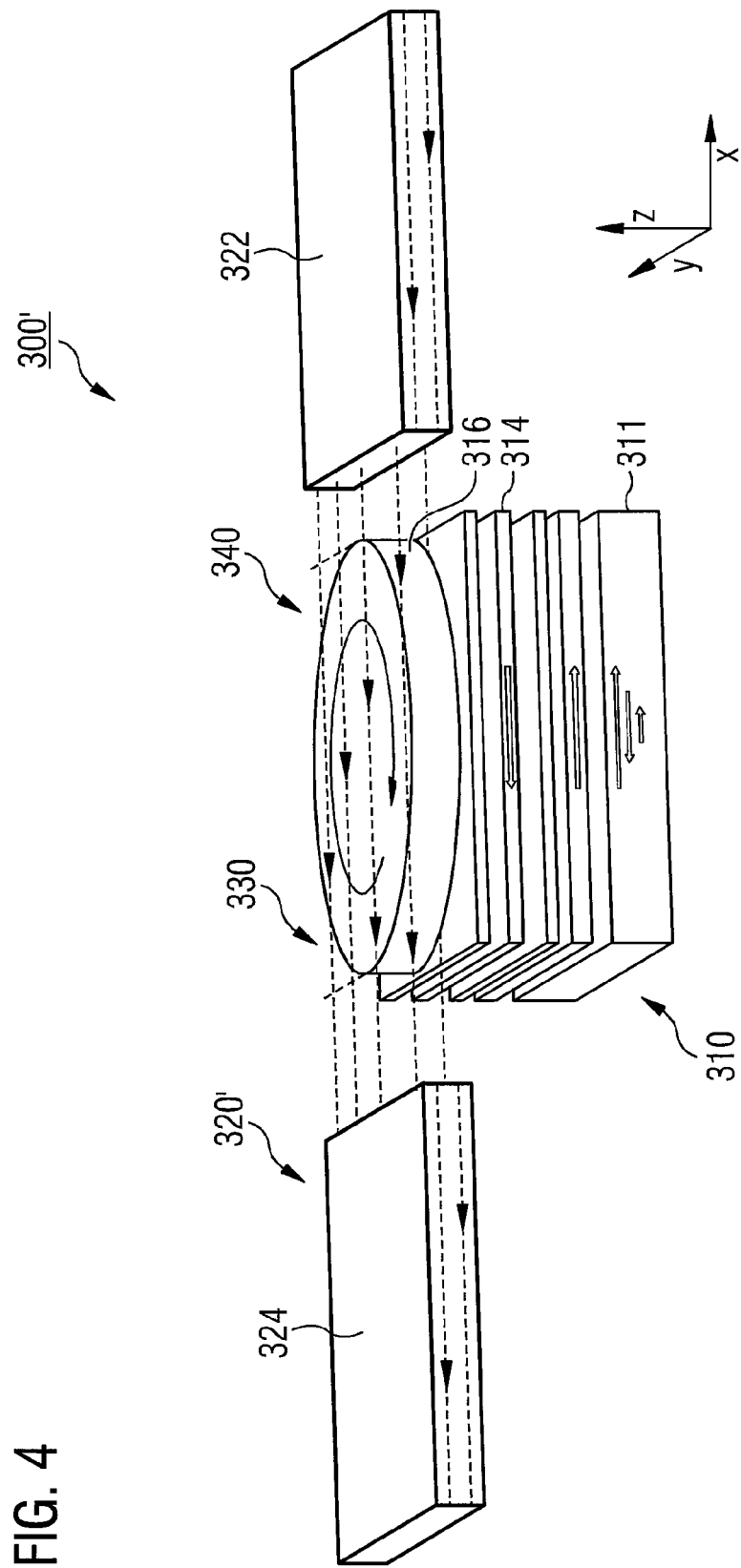
FIG. 4 shows a magnetic sensor device according to another example.
Figure 5:
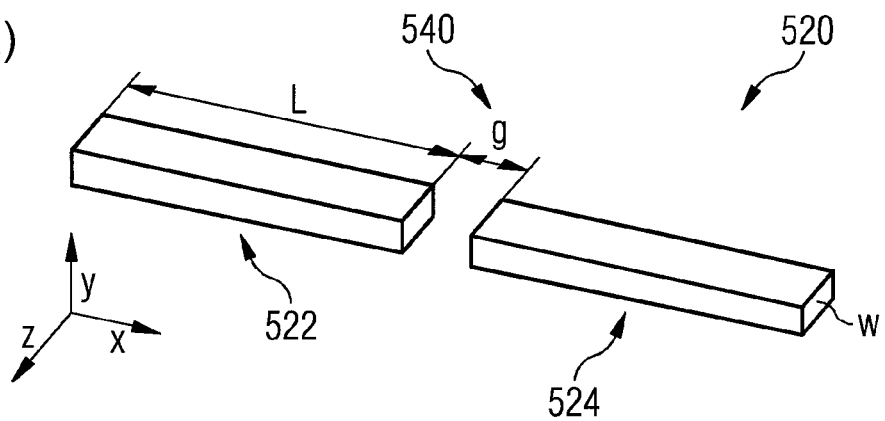
FIG. 5a-c illustrate different example shapes of magnetic flux concentrators.
Figure 5:
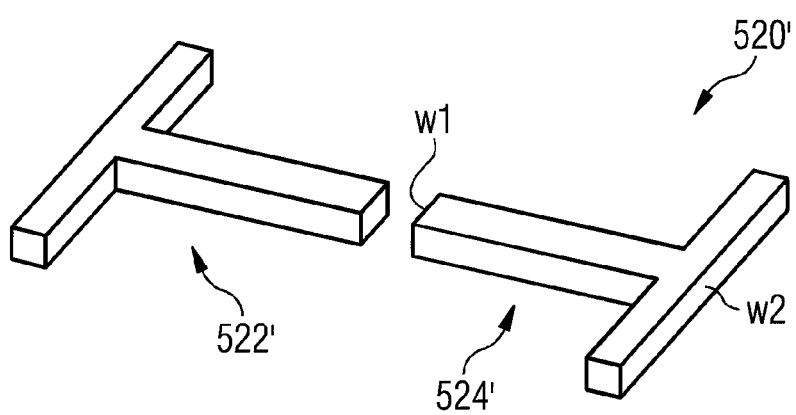
Figure 5:
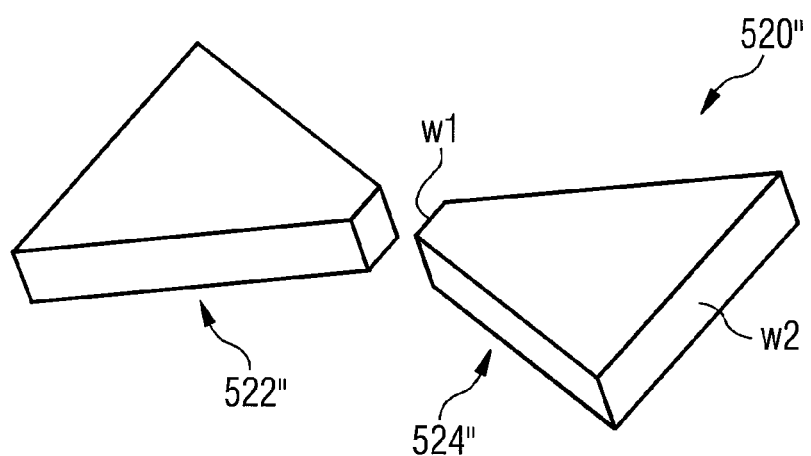

The example magnetic flux concentrators 320, 320' of FIGS. 3 and 4 comprise first and second linearly extending bar- or rod-like portions 322, 324. Flux concentrator portions 322, 324 extend in parallel to the layers of the layer stack forming xMR vortex sensor element 310 in order to increase the magnetic flux density of the external magnetic field 330 parallel to a straight line which extends collinear to portions 322, 324. In the examples illustrated in FIGS. 3 and 4, magnetic flux concentrator 320 is configured to increase the magnetic flux density parallel to the reference magnetization pattern (in x-direction) of the magnetic reference layer 314. The protrusion-like portions 322, 324 are separated by a gap 340, which can be an air gap. By means of gap 340 magnetic flux concentrator 320 can be configured to cause a magnetic stray field in the disc-shaped magnetic free layer 316. While magnetic free layer 316 is positioned outside (here: below) gap 340 in the example of FIG. 3, magnetic free layer 316 is positioned within gap 340 in the example of FIG. 4. In both examples magnetic free layer 316 is sensitive to x-components of the stray field between protrusions 322, 324. FIGS. 5a-c illustrate some possible shapes of magnetic flux concentrators. FIG. 5a shows a bar-shaped magnetic flux concentrator 520 with a pair of bar-shaped rods 522, 524. Each of the rods 522, 524 has a width w and a length 1. The gap 540 separating the rods 522, 524 has a width g, which can be in a range from 10-200 μm in some examples. FIG. 5b shows a T-shaped magnetic flux concentrator 520' with an opposing pair of T-shaped portions 522', 524'. Each of the T-shaped portions 522', 524' has design parameters w1 and w2, wherein w1 denotes the width of the stem portion and w2 denotes the width of the crossbar portion. FIG. 5c shows a triangular shaped magnetic flux concentrator 520" with an opposing pair of triangular shaped portions 522", 524". Each of the portions 522", 524" has design parameters w1 denoting the width of the smaller end portions facing the gap and w2 denoting the width of the wider end portions facing away from the gap.

Figure 6:
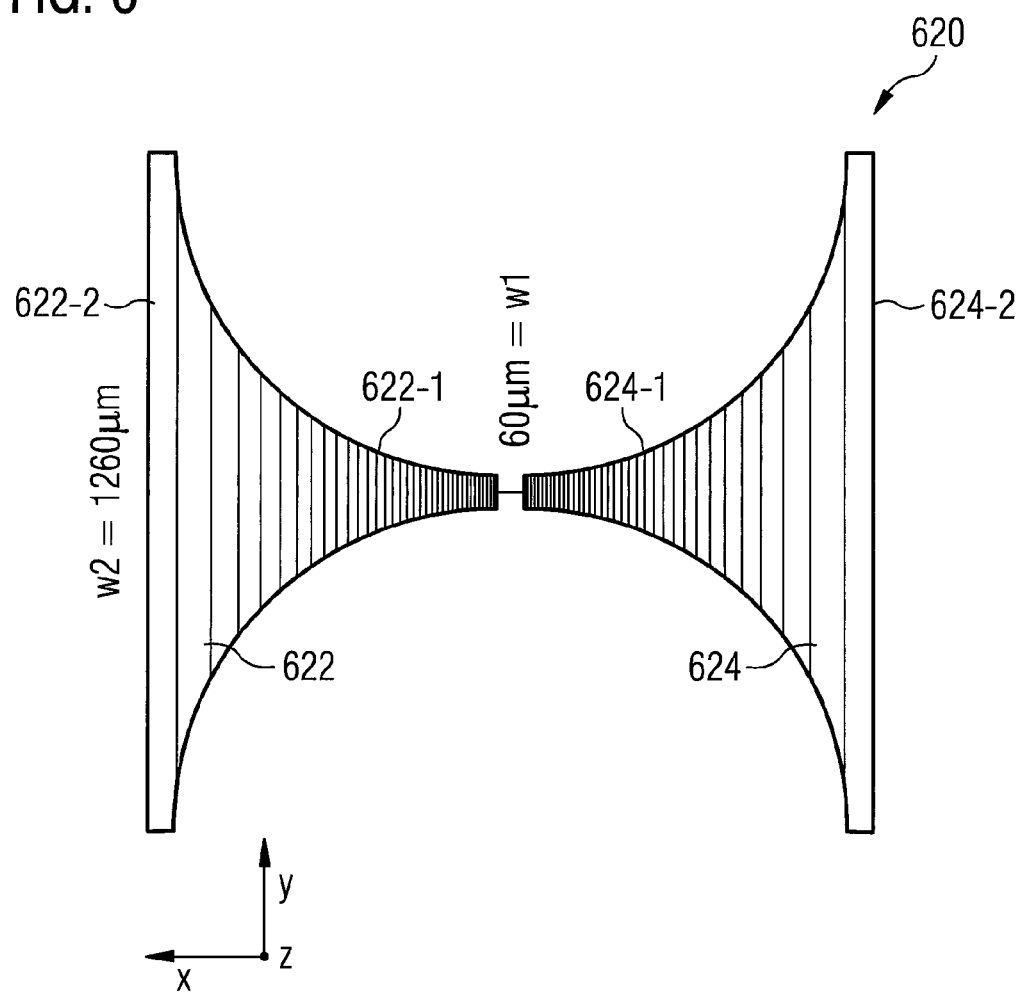
FIG. 6 shows a top view of an example magnetic flux concentrator.

Another possible design of a magnetic flux concentrator 620 is shown in FIG. 6. Magnetic flux concentrator 620 is somewhat similar to T-shaped magnetic flux concentrator 520' of FIG. 5b. In the example of FIG. 6, however, there is a gentle circular shaped transition between stem portions 622-1, 624-1 and associated crossbar portions 622-2, 624-2. This geometry can lead to a continuous increase of magnetic flux toward the gap 640 between stem portions 622-1, 624-1. As mentioned before, one or more vortex sensors can be placed inside, below or above the gap 640, which has a width of 60 μm in this particular example. Of course, the dimensions of gap 640 can be different in other examples.

FIG. 7 illustrates various example arrangements of magnetic flux concentrators 720, 720' and a 2-dimensional array of xMR vortex sensor elements 710 arranged within, underneath or above gap 740 between opposing portions 722, 724 or 722', 724' of magnetic flux concentrators 720, 720'. In the example of FIG. 7a, the magnetic flux concentrator 720 increases the flux density in x-direction. In the example of FIG. 7b, the magnetic flux concentrator 720' increases the flux density in y-direction. In the example of FIG. 7c, the magnetic flux concentrator increases the flux density in both x- and y-directions.

Figure 11:
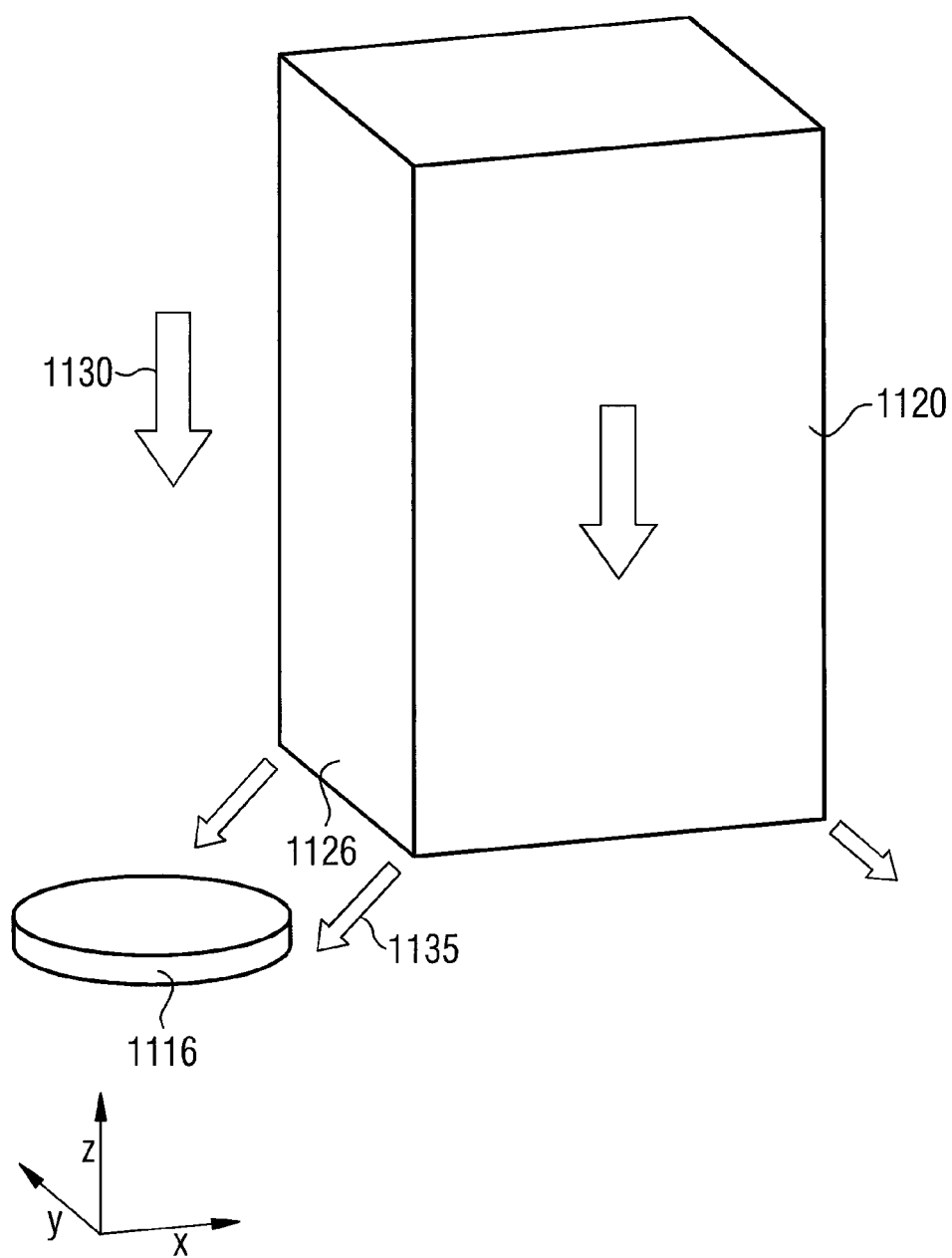
FIG. 11 illustrates a first example of a flux concentrator in conjunction with a vortex sensor, wherein the flux concentrator is configured to transform an external magnetic field perpendicular to a reference magnetization pattern into a magnetic field parallel to the reference magnetization pattern of a magnetic reference layer.
Figure 12:
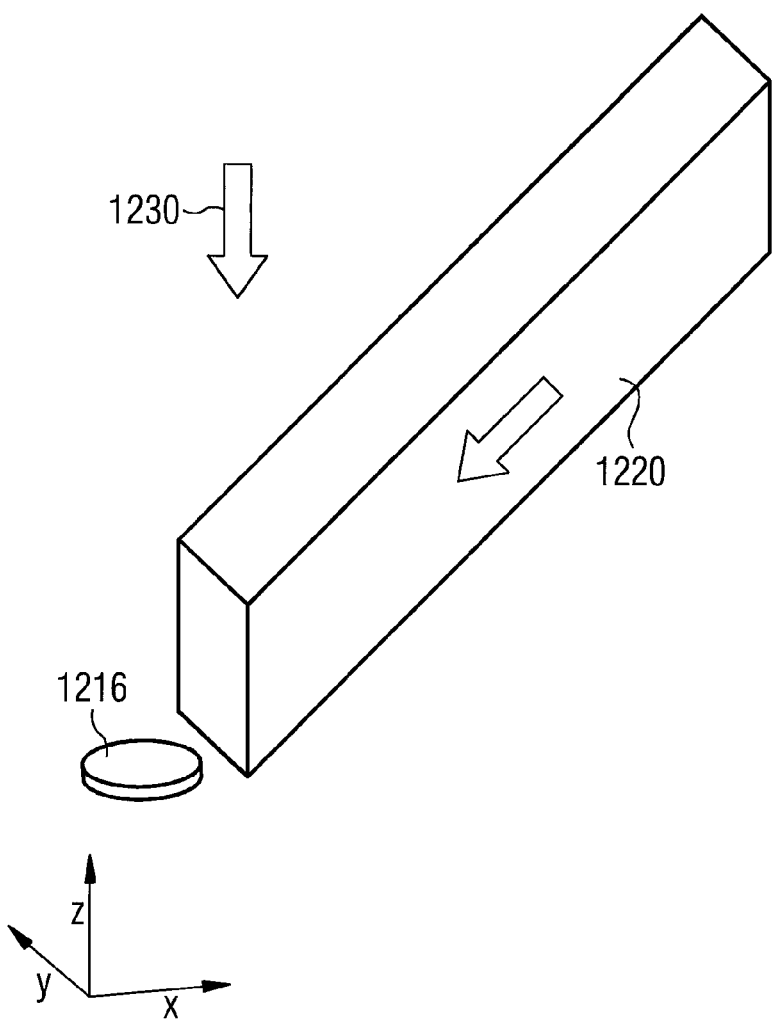
FIG. 12 shows a second example of a flux concentrator in conjunction with a vortex sensor, wherein the flux concentrator is configured to transform an external magnetic field perpendicular to a reference magnetization pattern into a magnetic field parallel to the reference magnetization pattern of a magnetic reference layer.

FIGS. 11 and 12 illustrate two further examples of flux concentrators in conjunction with vortex sensors. In both examples, the respective flux concentrator 1120 or 1220 is configured to transform an external magnetic field perpendicular to the reference magnetization pattern into a magnetic field parallel to the reference magnetization pattern of the magnetic reference layer. In the illustrated examples, the applied external field is in z-direction, while the reference magnetization is in x-direction.

In the example of FIG. 11, bar-like flux concentrator 1120 extends in z-direction, i.e., parallel the applied external magnetic field 1130. In other words, a longitudinal axis of flux concentrator 1120 extends along z-direction, while free layer 1116 of the vortex sensor is located in the x-y-plane and hence parallel to the vortex sensor's reference magnetization. Free layer 1116 is located horizontally displaced to an edge 1126 between a side face and bottom face of flux concentrator 1120. Due to the displacement in x-direction, an x-component of a stray field 1135 produced at the edge 1126 will penetrate into free layer 1116.

The bar-like flux concentrator 1220 shown in FIG. 12 extends inclined with respect to both z-direction and x-direction. In other words, its longitudinal axis has components in both x- and z-direction. Free layer 1216 is located proximate an end face of flux concentrator 1220. Flux concentrator 1220 concentrates magnetic flux of the applied external magnetic field 1230 (in z-direction) along its longitudinal axis. Thus, the concentrated magnetic flux also has an x-component which penetrates free layer 1216.

Note that flux concentrators 1120 or 1220 could be implemented using one or more vias through a semiconductor material, for example.

Figure 10:
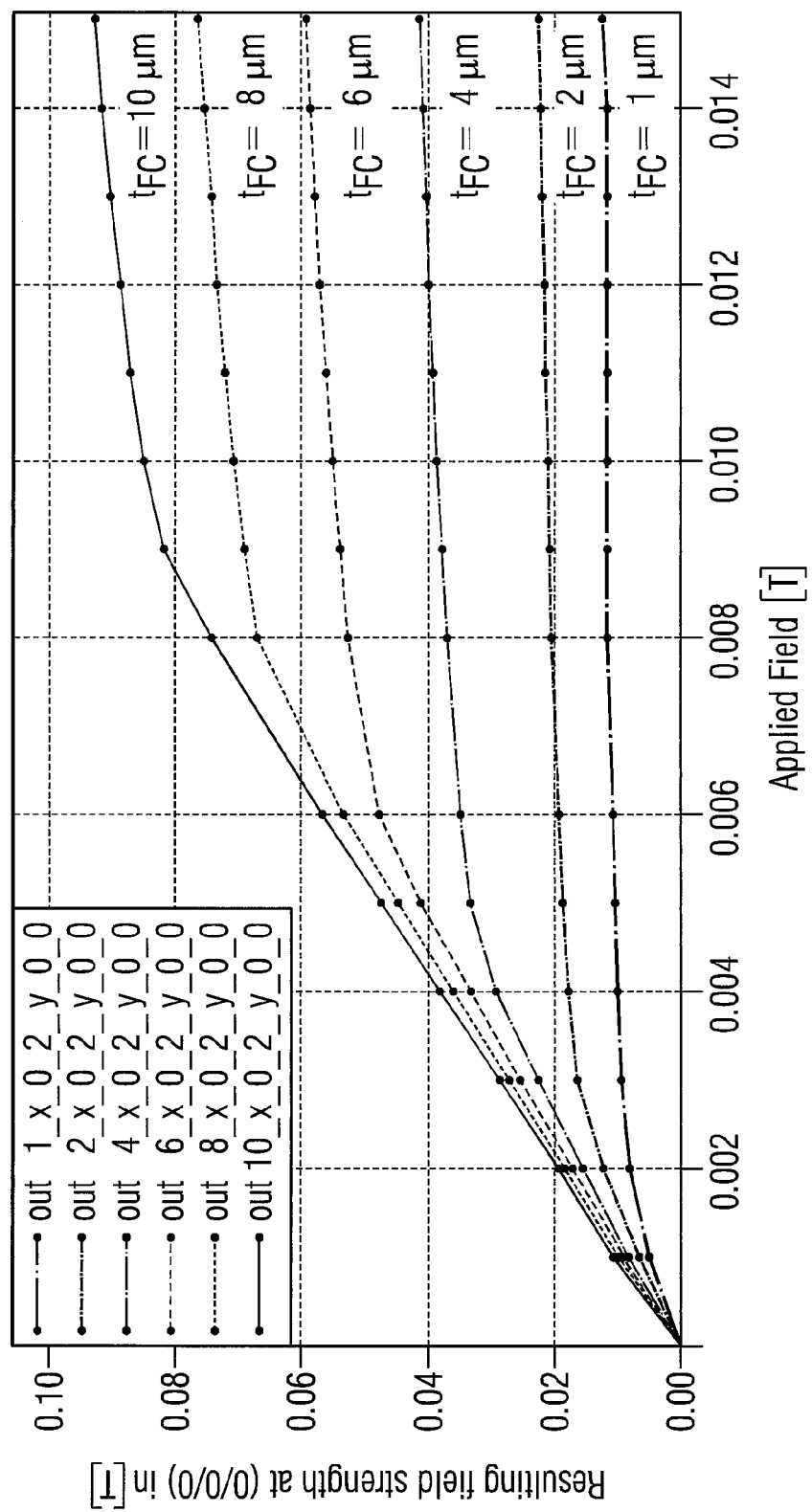
FIG. 10 illustrates the field generated by the flux-concentrator for different layer thicknesses of the flux-concentrator.

The basic working principle of the flux-concentrator can be seen in FIG. 8. In the illustrated example, the external field is applied in x-direction. From FIG. 8 (left) it can be seen that small external fields are basically linearly amplified. However, if the field exceeds about $B_x>0.01$ T, the flux concentrator starts to saturate and the generated (or amplified) field does the same. Hence, the amplification is drastically reduced for fields $B_x>0.01$ T in the illustrated example. Thus, it is possible to design a flux concentrator which only amplifies fields smaller than the annihilation field. The field range which is amplified can, for example, be well controlled by the thickness of the Flux-concentrator as shown in FIG. 10. The saturation field is for large and thick structures mainly a function of the material used. The actual value may be relative low e.g. for permalloy (Ni81Fe19) and higher for e.g. CoFe based alloys. FIG. 8 (right) shows the total field which is the sum of the external field and the field produced by the flux concentrator. Also here it can be seen that the amplification decreases for $B_x>0.01$ T.

In the following the proposed principle is applied to a vortex sensor with a hysteresis as shown in FIG. 9. Inside the gap of the flux concentrator a vortex sensor is placed. The original transfer curve of the vortex sensor is shown in FIG. 9 (left) by curve 910, which indicates a linear regime up to about 50 mT leading to only a moderate sensitivity. The sensitivity is improved by about a factor of 5 due to the flux concentrator. The sensitivity of the flux-concentrator vortex sensor is about 10%/mT. Most importantly the influence of the flux concentrator on the annihilation field is small as shown in FIG. 9 (left). $H_{an}$ is reduced from about 80 mT to about 60 mT. Hence, whereas the sensitivity is improved by a factor of 5 the annihilation field is only reduced by about 25%.

The skilled person having benefit from the present disclosure will appreciate that there are many possibilities in order to optimize the flux concentrator, such as the geometry and the material. One simple path for optimization is indicated in FIG. 10. In FIG. 10 the thickness $t_{FC}$ of the flux concentrator of FIG. 6 is varied from $t_{FC}=1$ μm to $t_{FC}=10$ μm. With increasing thickness of the flux concentrator the amplification factor can be increased. Furthermore, the saturation field of the flux concentrator increases with the layer thickness of the flux concentrator. This allows to tune and optimize the flux concentrator in order to meet the requirements of the vortex sensor.

Examples of the present disclosure allow to amplify magnetic fields for vortex sensors where it is required and can block too high fields in order to avoid destruction of the vortex sensor. Examples of the present disclosure may be used for wheel speed sensors, angle sensors and other magnetic field sensors, such as for biological applications, for example. Generally, examples of the present disclosure can be used for any application where a high sensitivity of the magnetic field sensor is required.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A magnetic sensor device, comprising:
   at least one magneto-resistive structure comprising a magnetic free layer configured to generate a closed flux magnetization pattern in the free layer, and a magnetic reference layer having non-closed flux reference magnetization pattern; and
   a magnetic flux concentrator configured to (i) increase a flux density of an external magnetic field in the magnetic free layer, and (ii) magnetically saturate when a strength of the external magnetic field exceeds a threshold value smaller than an annihilation field of the closed flux magnetization pattern,
   wherein the closed flux magnetization pattern is formed independently of the magnetic flux concentrator.

2. The magnetic sensor device of claim 1, wherein the magnetic free layer is of centrally symmetric shape.

3. The magnetic sensor device of claim 1, wherein the magnetic free layer is of rotationally symmetric shape.

4. The magnetic sensor device of claim 1, wherein a ratio between a thickness and a diameter of the magnetic free layer is in a range from 1/500 to 1/5.

5. The magnetic sensor device of claim 1, wherein the magnetic free layer has a thickness exceeding a thickness of the reference layer by at least a factor of 3.

6. The magnetic sensor device of claim 1, wherein the magnetic flux concentrator is implemented in the same layer as, or in a layer different from, the magnetic free layer.

7. The magnetic sensor device of claim 1, wherein the magnetic flux concentrator is configured to increase the magnetic flux density of the external magnetic field parallel to a straight line.

8. The magnetic sensor device of claim 7, wherein the magnetic flux concentrator is configured to increase the magnetic flux density parallel to the reference magnetization pattern of the magnetic reference layer.

9. The magnetic sensor device of claim 7, wherein the magnetic flux concentrator is configured to transform a magnetic field perpendicular to the reference magnetization pattern of the magnetic reference layer into a magnetic field parallel to the reference magnetization pattern.

10. The magnetic sensor device of claim 1, wherein the magnetic flux concentrator is configured to cause a magnetic stray field in the magnetic free layer.

11. The magnetic sensor device of claim 1, wherein the magnetic flux concentrator comprises a gap, and
    wherein the magnetic free layer is positioned in, below or above the gap of the magnetic flux concentrator.

12. The magnetic sensor device of claim 11, wherein the magnetic flux concentrator comprises a pair of opposing protrusions separated by the gap.

13. The magnetic sensor device of claim 12, wherein the protrusions extend parallel to the reference magnetization pattern of the magnetic reference layer.

14. The magnetic sensor device of claim 1, wherein the magnetic flux concentrator comprises soft-magnetic material.

15. The magnetic sensor device of claim 1, wherein the magneto-resistive structure is a Giant Magneto-Resistive (GMR) or Tunnel Magneto-Resistive (TMR) structure.

16. The magnetic sensor device of claim 1, wherein the closed flux magnetization pattern is a vortex magnetization pattern.

17. A magnetic sensor device, comprising:
    a magnetic flux concentrator; and
    a plurality of magneto-resistive sensor elements arranged proximate to the magnetic flux concentrator, each magneto-resistive sensor element from among the plurality of magneto-resistive sensor elements comprising a respective magnetic free layer configured to generate a vortex magnetization pattern in the respective magnetic free layer,
    wherein the magnetic flux concentrator is configured to (i) increase a flux density of an external magnetic field in the respective magnetic free layer of each magneto-resistive sensor element, and (ii) magnetically saturate when a strength of the external magnetic field exceeds a threshold value smaller than an annihilation field of the vortex magnetization pattern, wherein the vortex magnetization pattern is formed independently of the magnetic flux concentrator.

18. The magnetic sensor device of claim 17, wherein the plurality of magneto-resistive sensor elements are arranged proximate to a material gap of the magnetic flux concentrator.

19. The magnetic sensor device of claim 18, wherein the respective magnetic free layers of the plurality of magneto-resistive sensor elements are positioned in, above, or below the material gap of the magnetic flux concentrator.

20. A magnetic sensing method, comprising:

increasing a magnetic flux density of an external magnetic field in a magnetic free layer of at least one magneto-resistive structure, the magnetic free layer comprising a vortex magnetization pattern, wherein increasing the magnetic flux density includes arranging the magnetic free layer proximate to a magnetic flux concentrator such that the magnetic flux concentrator magnetically saturates when a strength of the external magnetic field exceeds a threshold value smaller than an annihilation field of the vortex magnetization pattern, wherein the vortex magnetization pattern is formed independently of the magnetic flux concentrator.

\* \* \* \* \*